(12) United States Patent
Cheng et al.

(10) Patent No.: US 11,923,352 B2
(45) Date of Patent: Mar. 5, 2024

(54) SEMICONDUCTOR DEVICE WITH CAPACITOR AND METHOD FOR FORMING THE SAME

(71) Applicant: TAIWAN SEMICONDUCTOR MANUFACTURING COMPANY LTD., Hsinchu (TW)

(72) Inventors: Hsin-Li Cheng, Hsinchu County (TW); Shu-Hui Su, Taipei County (TW); Yu-Chi Chang, Kaohsiung (TW); Yingkit Felix Tsui, Cupertino, CA (US); Shih-Fen Huang, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 17/587,235

(22) Filed: Jan. 28, 2022

(65) Prior Publication Data
US 2023/0246014 A1  Aug. 3, 2023

(51) Int. Cl.
*H01L 25/18* (2023.01)
*H01L 23/00* (2006.01)

(52) U.S. Cl.
CPC .............. *H01L 25/18* (2013.01); *H01L 24/05* (2013.01); *H01L 24/08* (2013.01); *H01L 2224/05624* (2013.01); *H01L 2224/05647* (2013.01); *H01L 2224/05666* (2013.01); *H01L 2224/05684* (2013.01); *H01L 2224/08145* (2013.01)

(58) Field of Classification Search
CPC ......... H01L 24/05; H01L 24/08; H01L 25/00; H01L 25/18; H01L 23/498; H01L 23/522; H01L 23/642; H01L 2224/08145
See application file for complete search history.

(56) References Cited

U.S. PATENT DOCUMENTS

| | | | |
|---|---|---|---|
| 2019/0043836 A1* | 2/2019 | Fastow | G11C 16/0483 |
| 2020/0294889 A1* | 9/2020 | Choi | H01L 23/3107 |
| 2021/0391713 A1* | 12/2021 | Nam | H02H 9/005 |
| 2022/0254756 A1* | 8/2022 | Choi | H01L 25/0652 |
| 2022/0375898 A1* | 11/2022 | Pandit | H01L 25/0657 |

\* cited by examiner

*Primary Examiner* — Suberr L Chi
*Assistant Examiner* — Carnell Hunter, III
(74) *Attorney, Agent, or Firm* — WPAT LAW; Anthony King

(57) ABSTRACT

A semiconductor device is provided. The semiconductor device comprises a first semiconductor die comprising a first capacitor, and a second semiconductor die in contact with the first semiconductor die and comprises a diode. The first semiconductor die and the second semiconductor die are arranged along a first direction, and a diode is configured to direct electrons accumulated at the first capacitor to a ground.

20 Claims, 10 Drawing Sheets

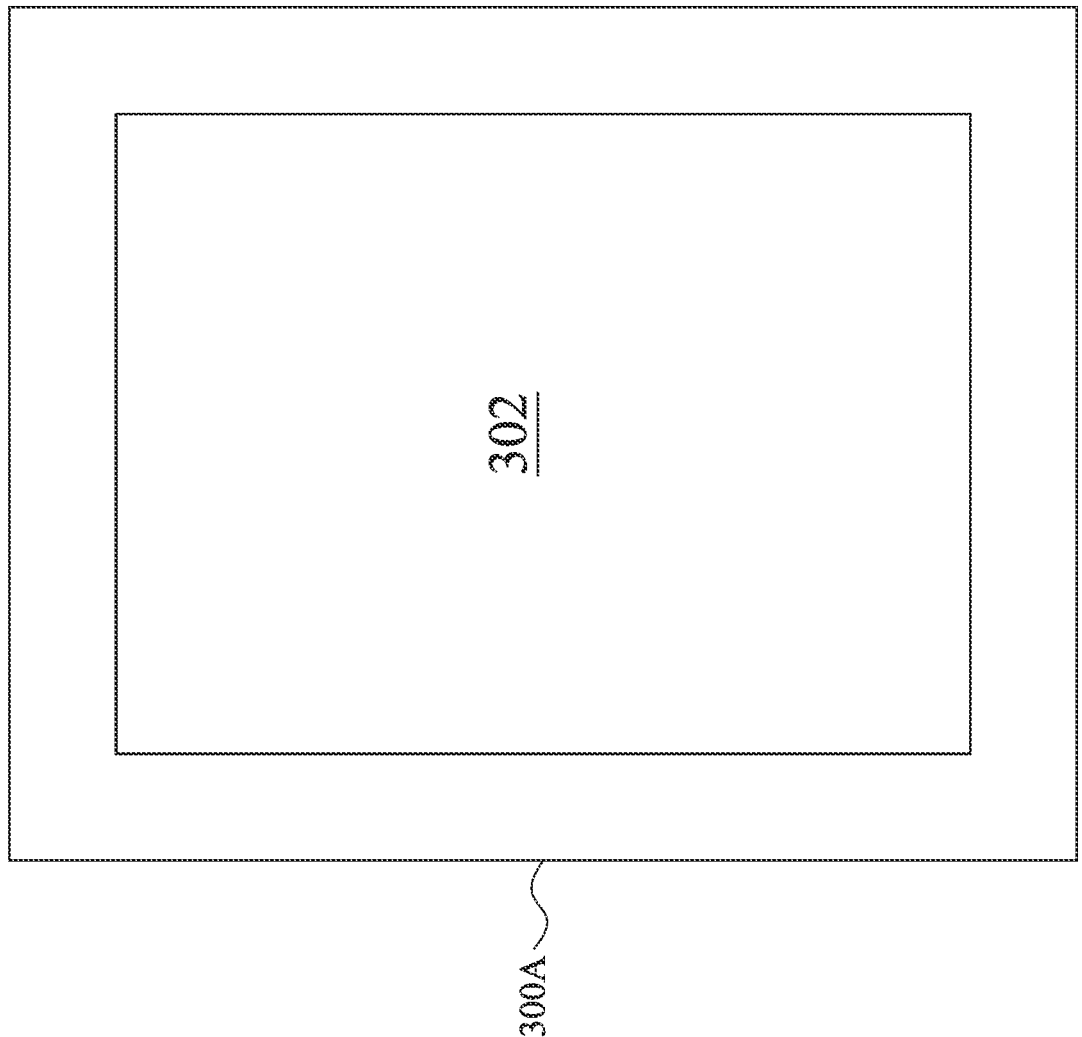

SEMICONDUCTOR DEVICE WITH CAPACITOR AND METHOD FOR FORMING THE SAME

BACKGROUND

The present disclosure relates, in general, to semiconductor devices and methods for manufacturing the same. Specifically, the present disclosure relates to semiconductor devices and methods for manufacturing semiconductor products with a capacitor.

Wafer on wafer (WOW) devices have been widely used for various applications, such as artificial intelligence (AI) application that utilizes high performance computing. In WOW devices, large capacitor are sometimes utilized to facilitate stable operations of the semiconductor devices, which may increase routing costs and deteriorate the reliability.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures can be arbitrarily increased or reduced for clarity of discussion.

FIG. 3A illustrates a top view of a capacitor of a semiconductor device, in accordance with some embodiments of the present disclosure.

DETAILED DESCRIPTION

Figure 1A:
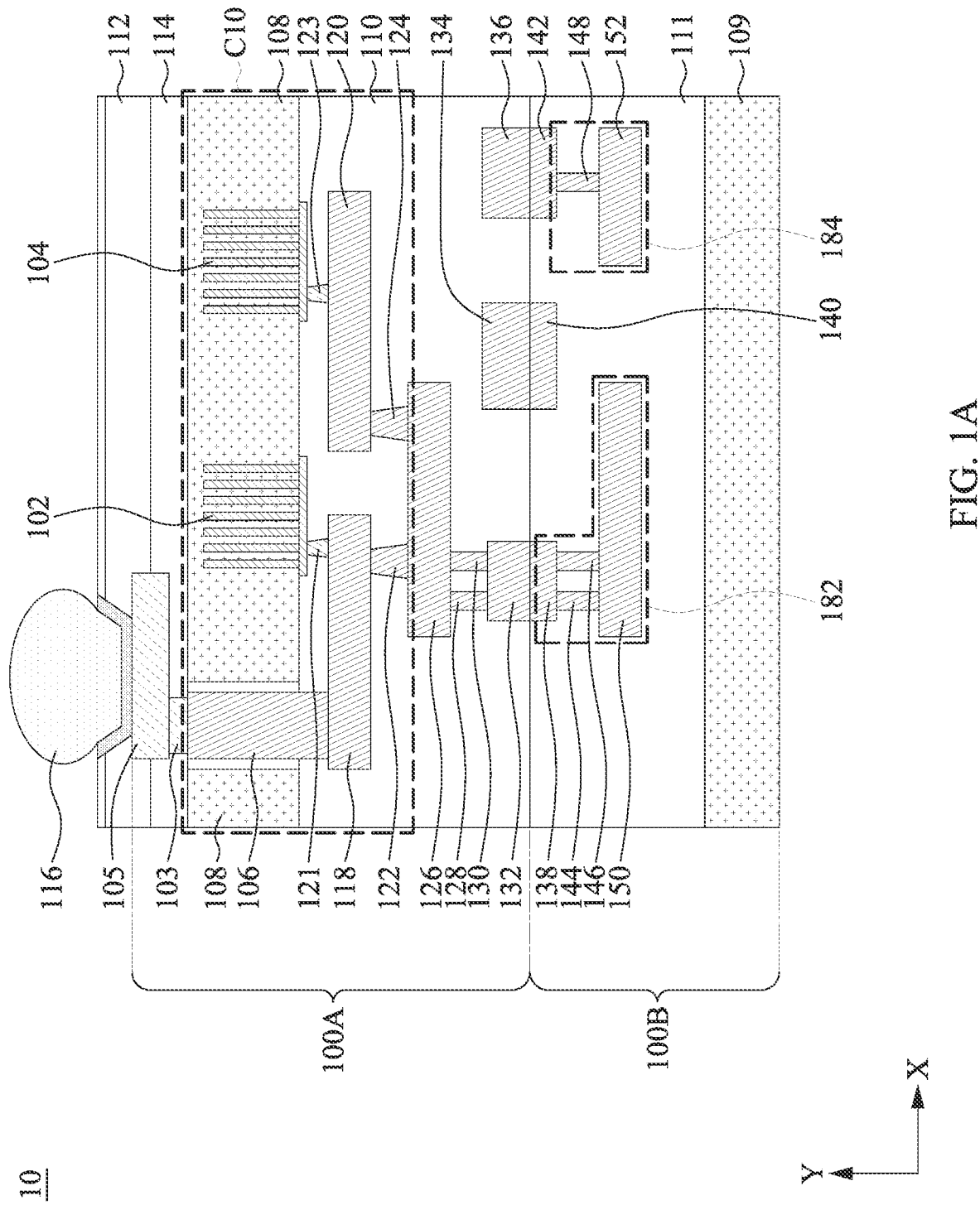
FIG. 1A illustrates a cross-section view of a semiconductor device, in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features can be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein may likewise be interpreted accordingly.

As used herein, although terms such as "first," "second" and "third" describe various elements, components, regions, layers and/or sections, these elements, components, regions, layers and/or sections should not be limited by these terms. These terms may only be used to distinguish one element, component, region, layer or section from another. Terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIG. 1A illustrates a cross-section view of a semiconductor device 10, in accordance with some embodiments of the present disclosure. The semiconductor device 10 includes a semiconductor die 100A and a semiconductor die 100B. The semiconductor die 100A is disposed above the semiconductor die 100B. The semiconductor die 100A is formed on the semiconductor die 100B along the Y direction. The semiconductor die 100A is electrically coupled with the semiconductor die 100B. The semiconductor die 100A is in electrically contact with the semiconductor die 100B. The semiconductor die 100A is in directly contact with the semiconductor die 100B.

The semiconductor device 10 can be wafer-on-wafer (WOW) configuration with the semiconductor die 100A bonded to the semiconductor die 100B. The semiconductor device 10 allows the stacking of both similar and/or dissimilar wafers, greatly improving inter-chip interconnect density while reducing a product's form factor. The semiconductor device 10 can provide high computing performance and high memory bandwidth to meet high performance computing (HPC) needs on clouds, data center, and high-end servers.

The semiconductor die 100B includes a substrate 109, an insulation layer 111, a conductive contact 140, and two processing units 182 and 184. The insulation layer 111 is disposed on the substrate 109. The processing units 182 and 184 are embedded within the insulation layer 111. The processing units 182 and 184 are surrounded by the insulation layer 111. The processing units 182 and 184 are encapsulated by the insulation layer 111.

The processing units 182 and 184 can be electronic components. The processing units 182 and 184 are configured to perform high-speed computing. In some embodiments, the processing units 182 and 184 can be anyone or combination of the following: logic, memory, integrated passive device (IPD), Micro Electro Mechanical Systems (MEMS), digital signal processor (DSP), microcontroller (MCU), central-processing unit (CPU) or a plurality of parallel processors relating the parallel processing environment to implement the operating system (OS), firmware, driver and/or other applications of an electronic apparatus.

The processing unit 182 includes a conductive contact 138 and conductive connections 144, 146 and 150. The conductive contact 138 and the conductive connections 144, 146 and 150 may include, for example but is not limited to, aluminum (Al), copper (Cu), titanium (Ti), tungsten (W) or other suitable material(s) (e.g. metal, alloy or non-metal conductive material(s)).

As shown in FIG. 1A, the conductive contact 138 is formed at the surface of the semiconductor die 100B facing the semiconductor die 100A. The conductive contact 138 is embedded within the insulation layer 111. An upper surface of the conductive contact 138 is exposed from the insulation layer 111 to be in contact with the semiconductor die 100A.

The processing unit 184 includes a conductive contact 142 and conductive connections 148 and 152. The conductive contact 142 is formed at the surface of the semiconductor die 100B facing the semiconductor die 100A. The conductive contact 142 is embedded within the insulation layer 111. An upper surface of the conductive contact 142 is exposed from the insulation layer 111 to be in contact with the semiconductor die 100A.

The semiconductor die 100A includes two capacitors 102 and 104, a conductive via 106, insulation layers 108, 110 and 114, conductive contacts 132, 134 and 136, and conductive connections 103, 105, 118, 120, 121, 122, 123, 124, 126, 128 and 130.

The insulation layers 108, 110 and 114 are formed along the Y direction. The insulation layer 108 is provided between the insulation layers 110 and 114. The insulation layer 108 may include silicon material. The material of the insulation layer 108 can be identical to the material of the insulation layers 110 and 114. The material of the insulation layer 108 can be different from the material of the insulation layers 110 and 114. The conductive via 106 and the capacitors 102 and 104 are in contact with the insulation layer 108. The capacitors 102 and 104 are embedded within the insulation layer 108. The conductive via 106 can extend into the insulation layer 108. The conductive via 106 can penetrate the insulation layer 108. The conductive via 106 can be a backside through silicon via (BTSV).

The capacitors 102, 104 and the conductive via 106 are arranged or formed along the X direction which is vertical to the Y direction. The conductive via 106 is adjacent to the capacitor 102. The conductive via 106 is spaced apart from the capacitor 102. The conductive via 106 is spaced apart from the capacitor 104. The capacitor 102 is separated from the capacitor 104.

In some embodiments, the capacitor 102 is electrically connected to the capacitor 104. The capacitor 102 can be in series connection with the capacitor 104. The capacitor 102 can be in parallel connection with the capacitor 104. In some embodiments, both the capacitors 102 and 104 are electrically connected to the conductive via 106.

The capacitors 102 and 104 can be deep trench capacitors (DTC). The DTCs are semiconductor devices that are used to add capacitance to various integrated circuits. An advantage of using DTCs over package decaps is that they can be freely placed as close as possible to the desired processing units. Additionally, DTCs can also provide higher capacitance per unit area.

In some embodiments, DTCs are commonly embedded in integrated passive devices (IPDs) and used in place of ceramic capacitors to reduce the size of semiconductor device, reduce the cost of semiconductor devices, increase the functionality of semiconductor devices, or any combination of the foregoing. Further, the DTC comprises multiple electrodes and one or more dielectric layers, where the multiple electrodes and the dielectric layers are alternatingly stacked in the trench. The multiple electrodes comprise a substrate electrode and one or more polysilicon electrodes. The substrate electrode is defined by a doped region of the semiconductor substrate that lines sidewalls of the trench.

Referring to FIG. 1A, the conductive contacts 132, 134 and 136, and the conductive connections 118, 120, 121, 122, 123, 124, 126, 128 and 130 are formed within the insulation layer 110. The conductive connection 118 is in contact with the conductive via 106. The conductive connection 118 is electrically connected to the capacitor 102. The conductive connection 120 is electrically connected to the capacitor 104.

The conductive contacts 132, 134 and 136 are formed adjacent a surface of the semiconductor die 100A facing the semiconductor die 100B. The conductive contacts 132, 134 and 136 are embedded within the insulation layer 110. The surface of the conductive contacts 132, 134 and 136 are exposed from the insulation layer 110 to be in contact with the conductive contacts 138, 140 and 142 of the semiconductor die 100B, respectively.

In some embodiments, the conductive contact 132 of the semiconductor die 100A is in direct contact with the conductive contact 138 of the semiconductor die 100B. The conductive contact 134 of the semiconductor die 100A is in direct contact with the conductive contact 140 of the semiconductor die 100B. The conductive contact 136 of the semiconductor die 100A is in direct contact with the conductive contact 142 of the semiconductor die 100B.

The semiconductor die 100A and the semiconductor die 100B can be directly connected through the conductive contacts 132 and 138. The semiconductor die 100A and the semiconductor die 100B can be directly connected through the conductive contacts 132, 134, 138 and 140. The semiconductor die 100A and the semiconductor die 100B can be directly connected through the conductive contacts 132, 134, 136, 138, 140 and 142.

Moreover, the conductive connections 103 and 105 are surrounded by the insulation layer 114. The conductive connection 105 is embedded within the encapsulation layer 112 and the insulation layer 114. The conductive connection 103 is in contact with the conductive via 106. The conductive connection 105 is in contact with the conductive connection 103. A portion of the conductive connection 105 is exposed from the insulation layer 114 and surrounded by the encapsulation layer 112. A portion of the conductive connection 105 is exposed from the encapsulation layer 112 and surrounded by the insulation layer 114.

The encapsulation layer 112 overlays the semiconductor die 100A. The encapsulation layer 112 covers the semiconductor die 100A. The encapsulation layer 112 includes an epoxy resin including fillers therein, a molding compound (e.g., an epoxy molding compound or other molding compound), a polyimide, a phenolic compound or material, a material including a silicone dispersed therein, or a combination thereof.

The solder ball 116 is surrounded by the encapsulation layer 112. In some embodiments, a portion of the solder ball 116 is embedded within the encapsulation layer 112, and another portion of the solder ball 116 is exposed from the encapsulation layer 112.

In some embodiments, at least some of the conductive via 106, the conductive contacts 132, 134 and 136, and the conductive connections 103, 105, 118, 120, 121, 122, 123, 124, 126, 128 and 130 of the semiconductor die 100A collectively form a power line to receive a power signal. The processing units 182 and 184 of the semiconductor die 100B are configured to be driven and/or operated by the power signal.

The power signal can be received by the conductive via 106. The capacitors 102 and 104 are electrically connected to the conductive via 106 to regulate the power signal. In addition, the conductive contact 132 is in direct touch with the conductive contact 138. Compared to the known techniques in which capacitors are usually disposed on peripheral boards while the interconnections between the capacitors and processing units are achieved by wires external to the semiconductor die, the capacitors 102 and 104 in the present disclosure are relatively close to the processing unit 182. Accordingly, the operating voltage for the semiconductor device 10 can have a relatively small variation.

Furthermore, since the capacitors 102 and 104 are close to the processing unit 182, the voltage loss of the power line can be lower. Therefore, the power consumption of the semiconductor device 10 can be lower. Additionally, with the capacitors 102 and 104 closer to the processing units 182 and 184, the latency of the semiconductor device 10 decreases and the response speed of the semiconductor device 10 increases.

Figure 1B:
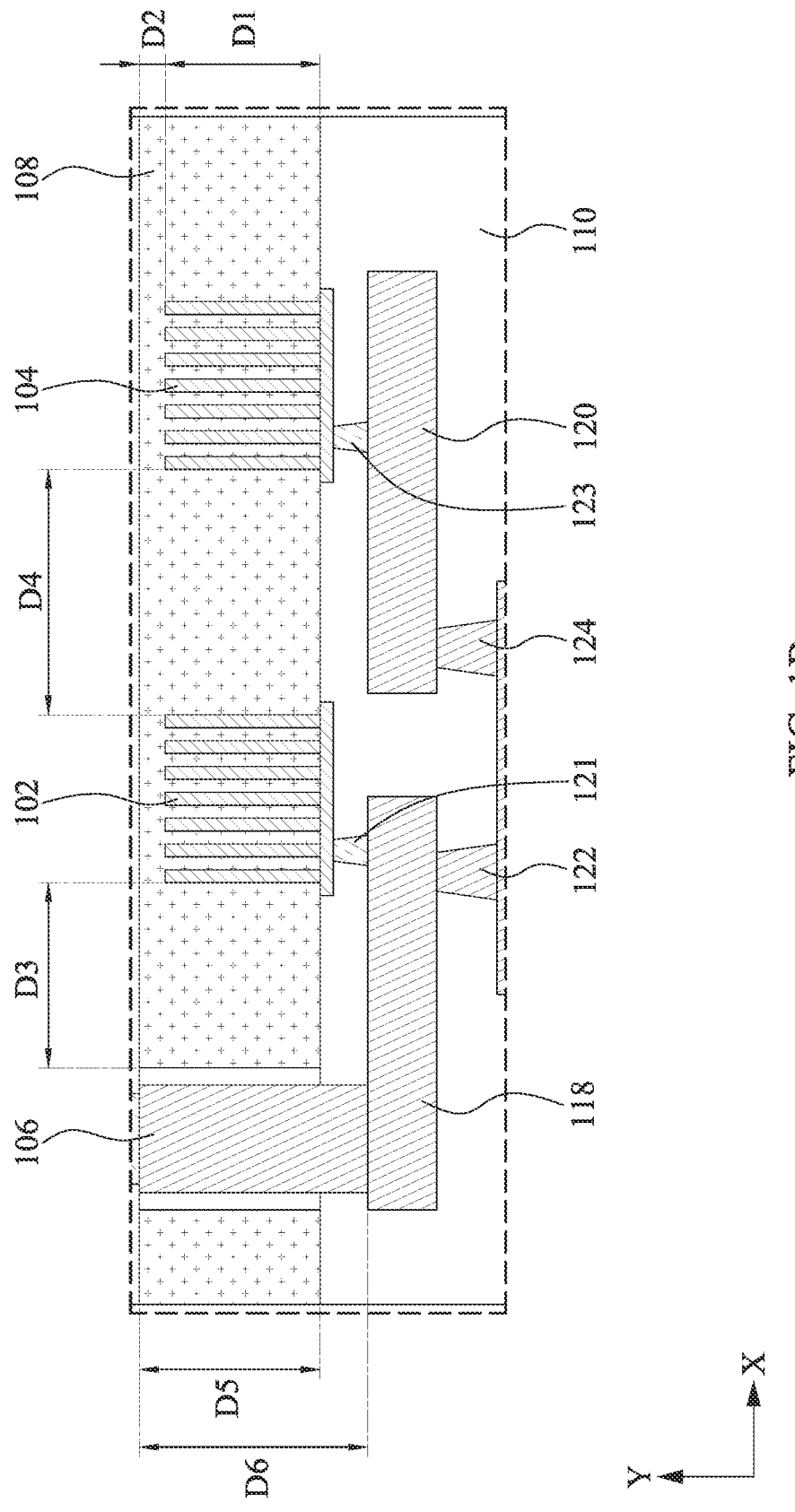
FIG. 1B illustrates a cross-section view of capacitors of a semiconductor device, in accordance with some embodiments of the present disclosure.

FIG. 1B illustrates a cross-section view C10 regarding the capacitors 102 and 104 of the semiconductor device 10, in accordance with some embodiments of the present disclosure. The depths of the capacitors 102 and 104 are D1. The distance between the capacitors 102 and 104 and the surface of the insulation layer 108 is D2. The distance between the conductive via 106 and the capacitor 102 is D3. The distance between the two capacitors 102 and 104 is D4. The thickness of the insulation layer 108 is D5. The depth of the conductive via 106 is D6.

The insulation layer 108 extends along the X direction, and the conductive via 106 extends along the Y direction. In some embodiments, more than two capacitors can be embedded within the insulation layer 108. More than two capacitors can be formed along the X direction in the semiconductor die 100B. The capacitors can be arranged in electrically series connection with each other. The capacitors can be arranged in electrically parallel connection with each other.

In some embodiments, the depth D1 of the capacitors 102 and 104 is greater than 6 um. The depth D1 of the capacitors 102 and 104 can be in the range of 3 um to 20 um. In some embodiments, the depth D1 of the capacitors 102 and 104 can be in the range of 6 um to 15 um. The distance D4 between the capacitors 102 and 104 is greater than 3 um. In some embodiments, the distance D4 between the capacitors 102 and 104 can be greater than 5 um. The distance D2 between the capacitors 102 and 104 and the surface of the insulation layer is greater than 1 um. In some embodiments, the distance D2 between the capacitors 102 and 104 and the surface of the insulation layer can be greater than 1.5 um.

In some embodiments, the depth D1 of the capacitors 102 and 104 is smaller than the thickness D5 of the insulation layer 108 by the distance D2. The depth D1 of the capacitors 102 and 104 is smaller than the depth D6 of the conductive via 106. The distance D4 between the capacitors 102 and 104 is smaller than the depth D1 of the capacitors 102 and 104. The distance D3 between the conductive via 106 and the capacitor 102 is smaller than distance D4 between the capacitors 102 and 104. The distance D3 between the conductive via 106 and the capacitor 102 is smaller than the depth D1 of the capacitors 102 and 104.

In addition, the distance D2 between the capacitors 102 and 104 and the surface of the insulation layer 108 is smaller than the distance D3 between the conductive via 106 and the capacitor 102. The distance D2 between the capacitors 102 and 104 and the surface of the insulation layer 108 is smaller than the depth D1 of the capacitors 102 and 104.

Furthermore, the distance D4 between the capacitors 102 and 104 is smaller than the thickness D5 of the insulation layer 108. The distance D4 between the capacitors 102 and 104 is smaller than the depth D6 of the conductive via 106. The thickness D5 of the insulation layer 108 is smaller than the depth D6 of the conductive via 106.

Figure 1C:
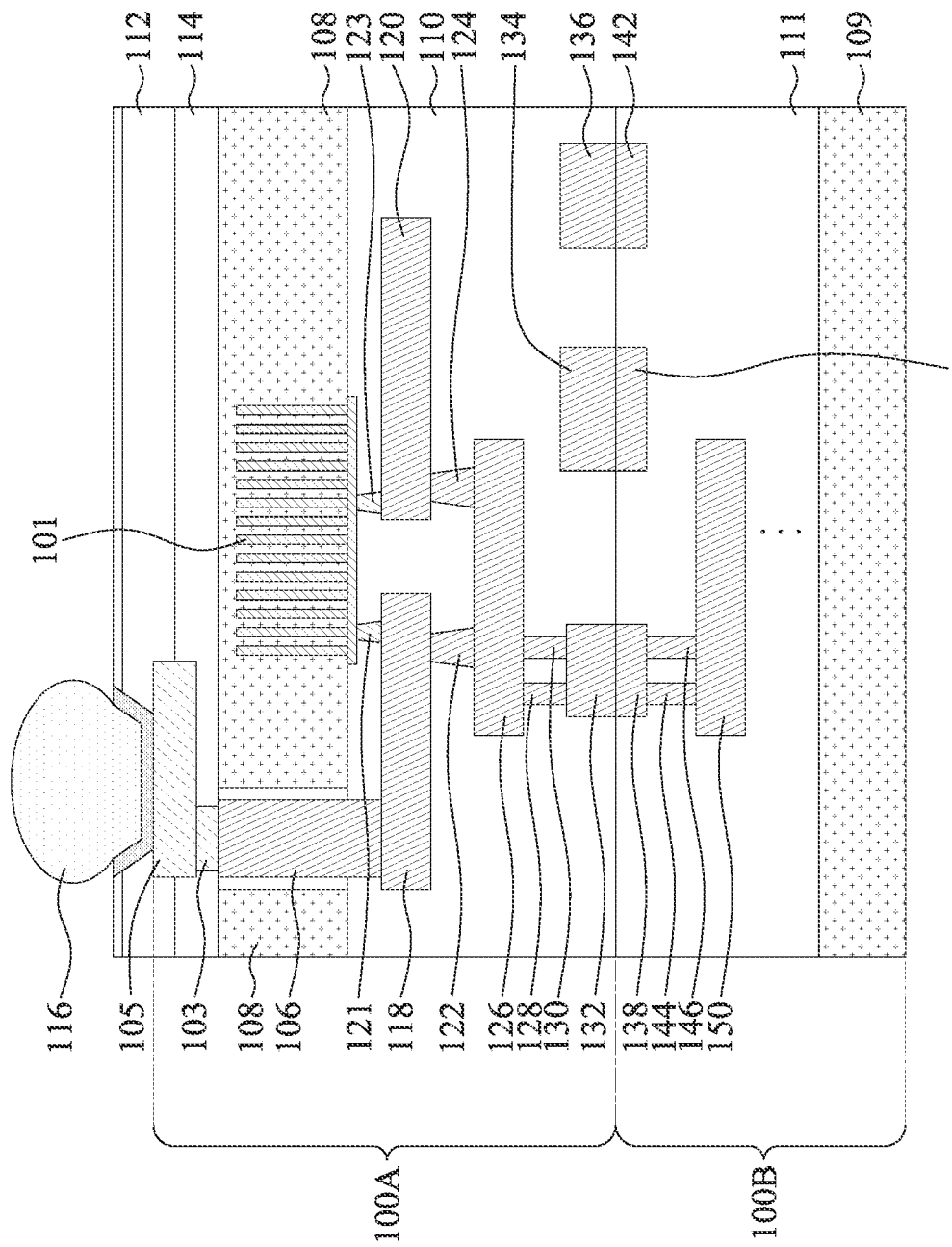
FIG. 1C illustrates a cross-section view of a semiconductor device, in accordance with some embodiments of the present disclosure.

FIG. 1C illustrates a cross-section view of the semiconductor device 10A, in accordance with some embodiments of the present disclosure. The difference between the embodiment of FIG. 1C and the embodiment of FIG. 1B relies on the capacitor 101. Two capacitors 102 and 104 are included in the semiconductor device 10 of FIG. 1B, while one capacitor 101 is included in the semiconductor device 10A of FIG. 1C.

Referring to FIG. 1C, the capacitor 101 can be electrically connected to the solder ball 116, through the conductive connections 105 and 103, the conductive via 106, and the conductive connections 118 and 121. The capacitor 101 can be electrically coupled to a power line configured to provide power to one or more processing units within the semiconductor die 100B.

The number of the capacitors can be adjusted based on the needs of application for users. For the application in the field of artificial intelligence (AI), a single capacitor with relative high capacitance (i.e., a big capacitor such as the capacitor 101) may be formed in the semiconductor die 100A of the semiconductor device 10A as shown in FIG. 1C. For other applications such as imaging processing or data computing, two or more capacitors with relatively small capacitance (i.e., small capacitors such as capacitors 102 and 104), may be formed in the semiconductor die 100A of the semiconductor device 10 as shown in FIG. 1B.

In some embodiments, the capacitors within the semiconductor die can store or hold the electrons generated from the power signal for driving the processing unit of the semiconductor device. The generated electrons can be of a large amount and can sometimes deteriorate or damage the semiconductor device. In some embodiments, the capacitors can be used to provide the function of Electrostatic Discharge (ESD) and protect the semiconductor device by accumulating the electrons.

Figure 2A:
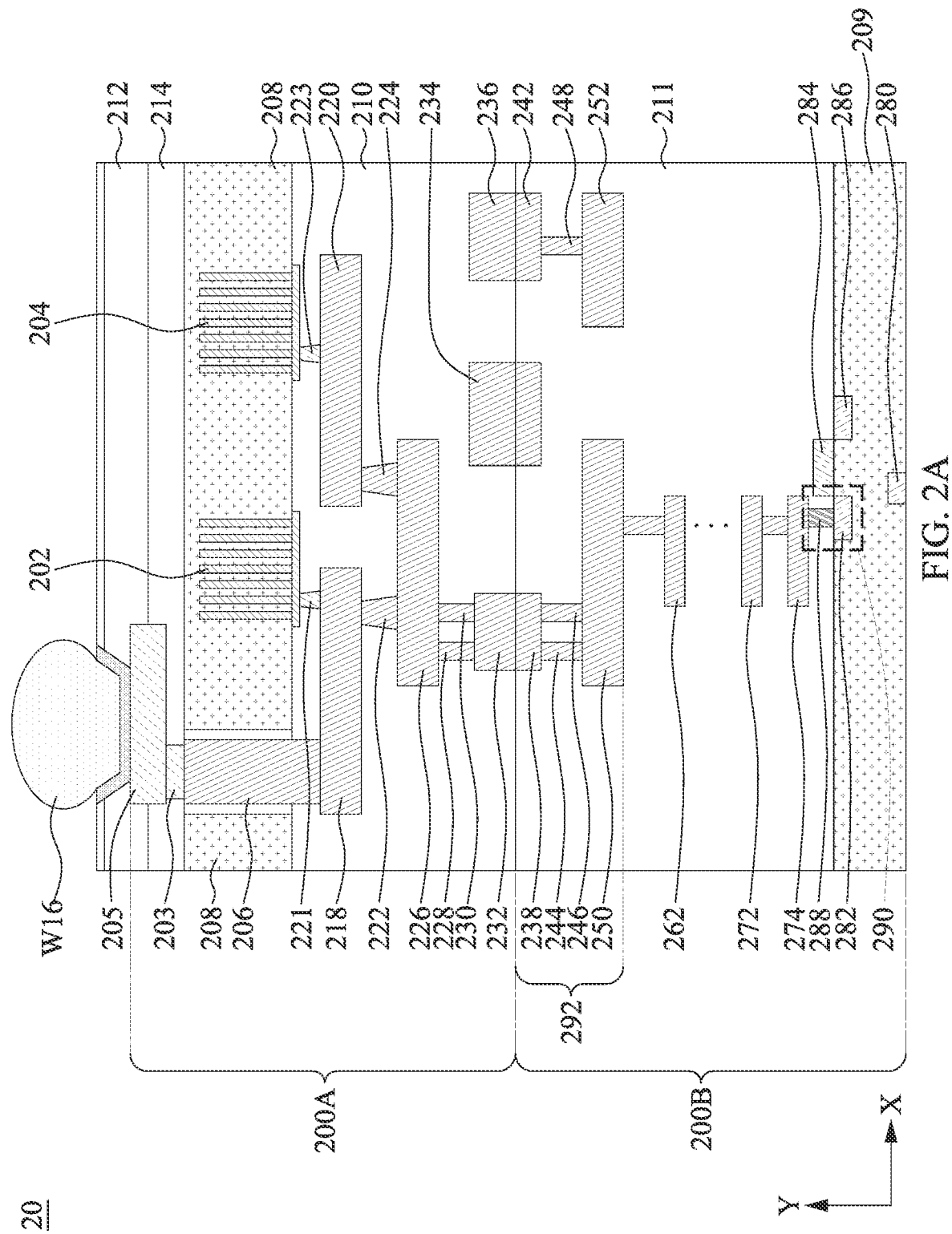
FIG. 2A illustrates a cross-section view of a semiconductor device, in accordance with some embodiments of the present disclosure.

FIG. 2A illustrates a cross-section view of a semiconductor device 20, in accordance with some embodiments of the present disclosure.

The semiconductor device 20 can be WOW configuration with the semiconductor die 200A directly bonded to the semiconductor die 200B. The semiconductor device 20 includes the semiconductor die 200A and the semiconductor die 200B. The semiconductor die 200A is disposed above the semiconductor die 200B. The semiconductor die 200A is formed on the semiconductor die 200B along the Y direction. The semiconductor die 200A is in electrically contact with the semiconductor die 200B. The semiconductor die 200A is in directly contact with the semiconductor die 200B.

The semiconductor die 200B includes a processing unit 292, several conductive connections 262 to 272 and 274, a diode 290, a conductive component 284, a doped region 286, and a ground terminal 280. The diode 290 can further include a conductive connection 288 and a doped region 282. More specifically the conductive connection 288 can be the cathode of the diode 290, and the doped region 282 can be the anode of the diode 290. In some embodiments, the diode 290 is configured to be reversely biased for passing the electrons to the ground terminal 280.

As shown in FIG. 2A, the conductive component 284 is disposed above the substrate 209 and also between two doped regions 282 and 286. The ground terminal 280 and the doped regions 282 and 286 are surrounded by the substrate 209. The ground terminal 280 and the doped regions 282 and 286 can be formed within the substrate 209.

The conductive component 284 and the doped regions 282 and 286 can form a transistor, such as an n-channel MOSFET or a p-channel MOSFET. The conductive component 284 can function as a gate electrode of the transistor, and the doped regions 282 and 286 can function as drain and source of the transistor. In some embodiments, the diode 290 can be a portion of the transistor collectively formed by the conductive component 284 and the doped regions 282 and 286.

The conductive connection 288 is disposed between the conductive connection 274 and the doped region 282. The conductive connection 288 can be a portion of the power line of the semiconductor device 20. At least some of the conductive via 206, the conductive contacts 232, 234 and 236, and the conductive connections 203, 205, 218 to 252 of the semiconductor device 20 form the power line to receive a power signal. The power signal is configured to drive and operate the processing unit 292 embedded within the semiconductor die 200B.

When the semiconductor device 20 is powered on, the power signal will be transmitted through the power line to operate the processing unit 292. During the operation process, certain electrons can be trapped and accumulated in the capacitors 202 and 204. The electrons accumulated in the capacitors 202 and 204 can be released to the power line when appropriate to reduce the variation of the power signal and regulate the power signal.

In some embodiments, the diode 290 is configured to direct electrons accumulated at the capacitors 202 and 204 to the ground terminal 280. The diode 290 is configured to provide another path for the power line so that the electrons can migrate to the ground terminal 280. The diode 290 can be used to regulate the electrons generated from the power signal. The diode 290 can improve the charging immunity and increase the reliability of the semiconductor device 20. The diode 290 can be used to prevent the semiconductor device 20 from being damaged due to the high voltage or high current from the power signal.

Figure 2B:
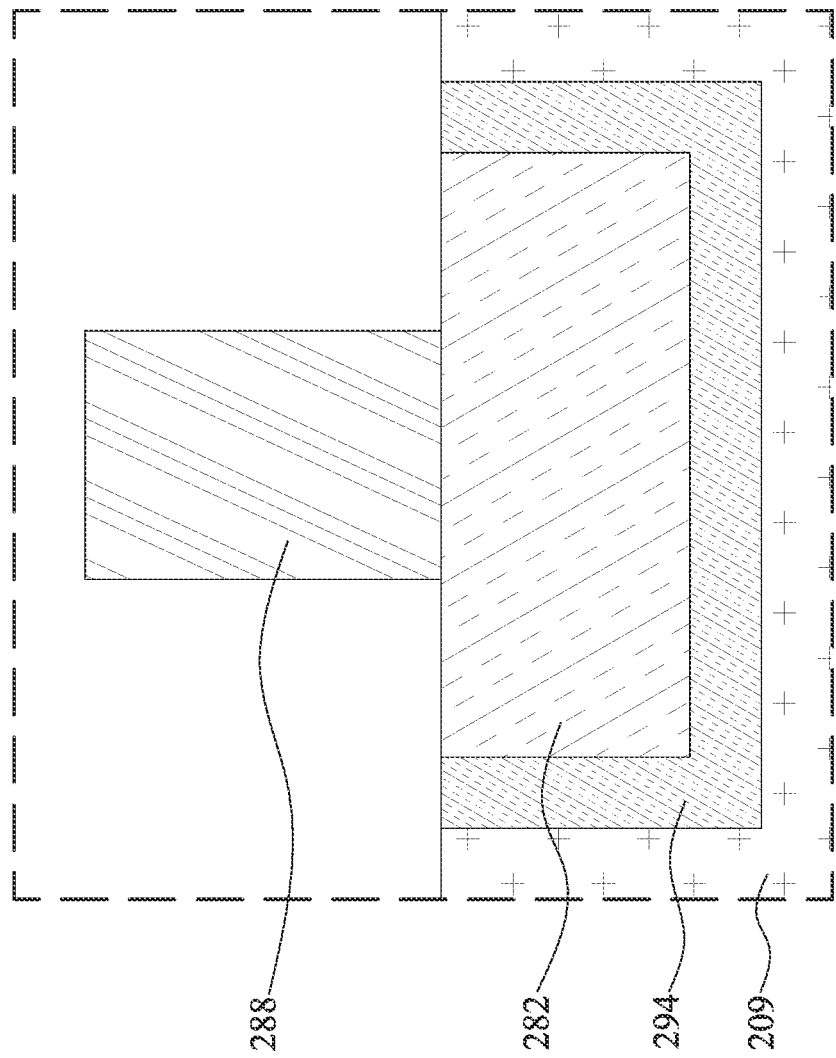
FIG. 2B illustrates a cross-section view of a diode of semiconductor device, in accordance with some embodiments of the present disclosure.

FIG. 2B illustrates a cross-section view of a diode 290A in accordance with some embodiments of the present disclosure. The diode 290A can correspond to the diode 290 shown in FIG. 2A. The diode 290A includes the conductive connection 288 and the doped region 282. The conductive connection 288 is disposed above the doped region 282. The conductive connection 288 is in contact with the doped region 282.

In some embodiments, the doped region 282 can be embedded within the well region 294. The doped region 282 can be P-type doped region. The well region 294 can be N-type well when the doped region 282 is P-type. The doped region 282 and the well region 294 are formed within the substrate 209. The doped region 282 and the well region 294 are surrounded by the substrate 209.

Figure 2C:
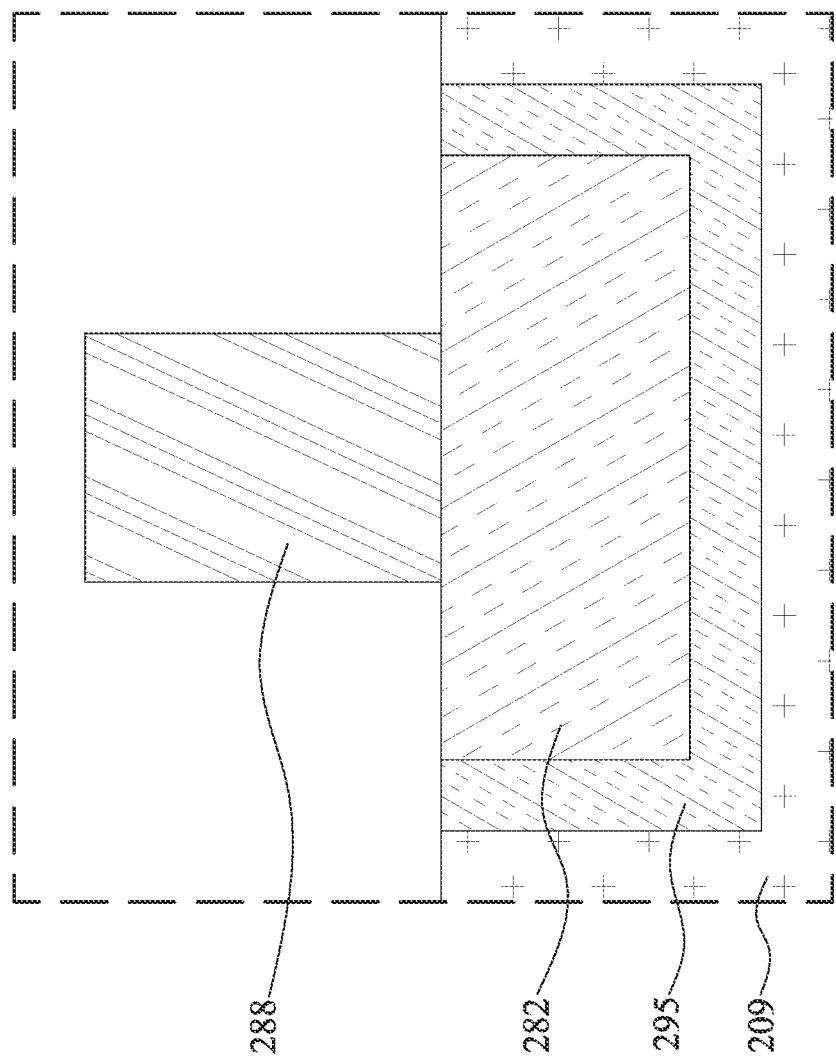
FIG. 2C illustrates a cross-section view of a diode of semiconductor device, in accordance with some embodiments of the present disclosure.

FIG. 2C illustrates another cross-section view of a diode 290B in accordance with some embodiments of the present disclosure. The diode 290B can correspond to the diode 290 shown in FIG. 2A. The diode 290B includes the conductive connection 288 and the doped region 282. The conductive connection 288 is disposed above the doped region 282. The conductive connection 288 is in contact with the doped region 282.

In some embodiments, the doped region 282 can be embedded within the well region 295. The doped region 282 can be N-type doped region. The well region 295 can be P-type well when the doped region 282 is N-type. The doped region 282 and the well region 295 are formed within the substrate 209. The doped region 282 and the well region 295 are surrounded by the substrate 209.

FIG. 3A illustrates a top view of the capacitor 302 of the semiconductor device 30A, in accordance with some embodiments of the present disclosure. The semiconductor device 30A of FIG. 3A can be similar to the semiconductor device 10A of FIG. 1C.

The semiconductor device 30A includes a semiconductor die 300A. The semiconductor die 300A includes a capacitor 302 and a single processing unit (not shown) underneath the capacitor 302. The capacitor 302 is electrically connected to the single processing unit within the semiconductor die 300A. In some embodiments, the capacitor 302 can be a deep trench capacitor (DTC). The capacitor 302 can be of large capacitance to store or accumulate a high volume of electrons.

Figure 3B:
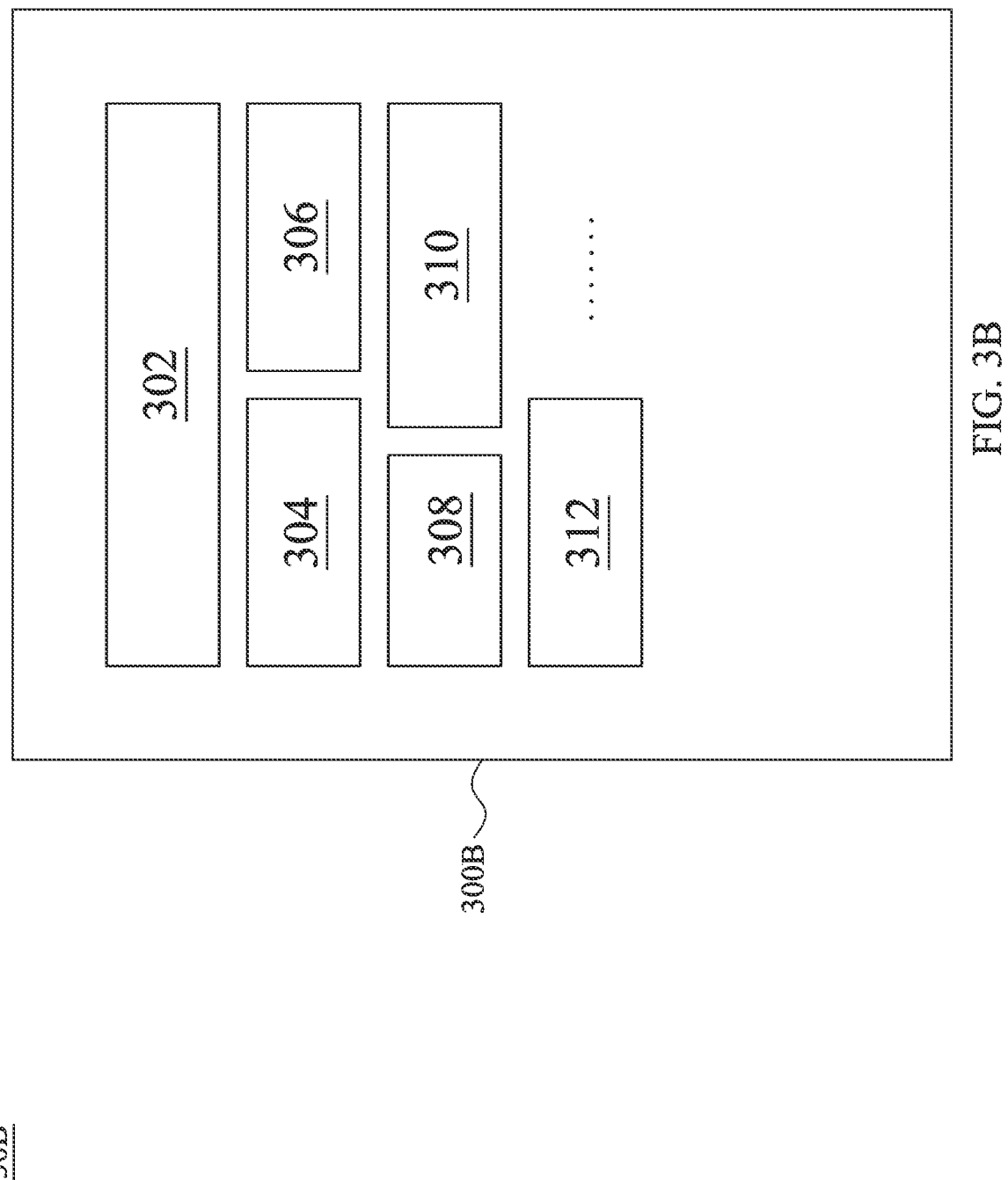
FIG. 3B illustrates a top view of capacitors of a semiconductor device, in accordance with some embodiments of the present disclosure.

FIG. 3B illustrates a top view of multiple capacitors 302 to 312 of the semiconductor device 30B, in accordance with some embodiments of the present disclosure. The semiconductor device 30B of FIG. 3B is similar to the semiconductor device 20 of FIG. 2A.

The semiconductor device 30B includes a semiconductor die 300B. The semiconductor die 300B includes several capacitors 302, 304, 306, 308, 310, and 312. The semiconductor die 300B further includes several processing units (not shown) underneath the capacitors 302 to 312. In some embodiments, each of the processing units can be electrically connected to one of the capacitors 302 to 312. In some embodiments, each of the processing units can be electrically connected to two or more of the capacitors 302 to 312.

In some embodiments, the capacitors 302 to 312 can be DTCs. Some of the capacitors 302 to 312 can be of small capacitance to store or accumulate a small volume of electrons. In some embodiments, the capacitor 302 of FIG. 3A can have a large capacitance higher than some of the capacitance of the capacitors 302 to 312 as shown in FIG. 3B. The capacitor 302 of FIG. 3A can have a large capacitance higher than most of the capacitance of the capacitors 302 to 312 of FIG. 3B. The capacitor 302 of FIG. 3A can have a large capacitance higher than the capacitance of each of the capacitors 302 to 312 of FIG. 3B.

In some embodiments, the number of the capacitors can be determined according to the technical field of the applications for the product which includes the semiconductor device. For the application in the field of AI technology wherein a single giant processing unit is utilized, a single big capacitor 302 may be formed in the semiconductor device 30A as shown in FIG. 3A. For other applications such as imaging processing or data computing wherein multiple small-scale processing units are utilized, a plurality of capacitors 302 to 312 can be formed in the semiconductor device 30B as shown in FIG. 3B.

Figure 4:
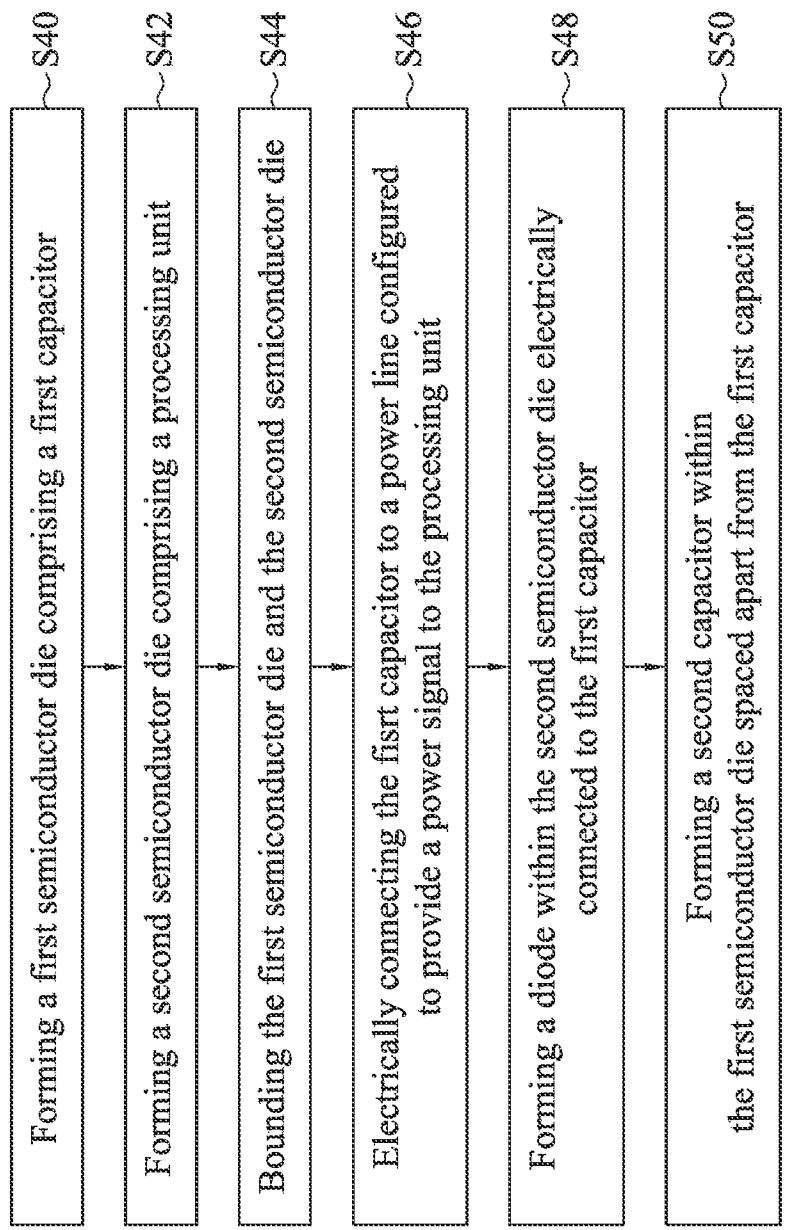
FIG. 4 illustrates a flow chart including operations for manufacturing a semiconductor device, in accordance with some embodiments of the present disclosure.

FIG. 4 illustrates a flow chart including operations for manufacturing a semiconductor device, in accordance with some embodiments of the present disclosure. The flowchart of FIG. 4 includes operations S40, S42, S44, S46, S48 and S50. Although the operations S40, S42, S44, S46, S48 and S50 of FIG. 4 are depicted in sequence, the operations S40, S42, S44, S46, S48 and S50 can be performed in an order different from that shown in FIG. 4.

In the operation S40, a first semiconductor including a first capacitor is formed. The first capacitor can be a DTC. In the operation S42, a second semiconductor die including a processing unit is formed. In the operation S44, the first semiconductor die and the second semiconductor die are bounded. In some embodiments, the first semiconductor die can be directly bounded to the second semiconductor die. The first semiconductor die can be in direct contact to the second semiconductor die.

In the operation S46, the first capacitor is electrically connected to a power line, and the power line is configured to provide a power signal to the processing unit. In the operation S48, a diode is formed within the second semiconductor die, and the diode is electrically connected to the first capacitor. The diode is configured to be reversely biased. The diode can be formed as a portion of a transistor.

In the operation S50, a second capacitor is formed within the first semiconductor die, and the second capacitor is spaced apart from the first capacitor. The second capacitor can be a DTC. The second capacitor can be spaced apart from the first capacitor. The second capacitor and the first capacitor can be encapsulated within an insulation layer.

Figure 5:
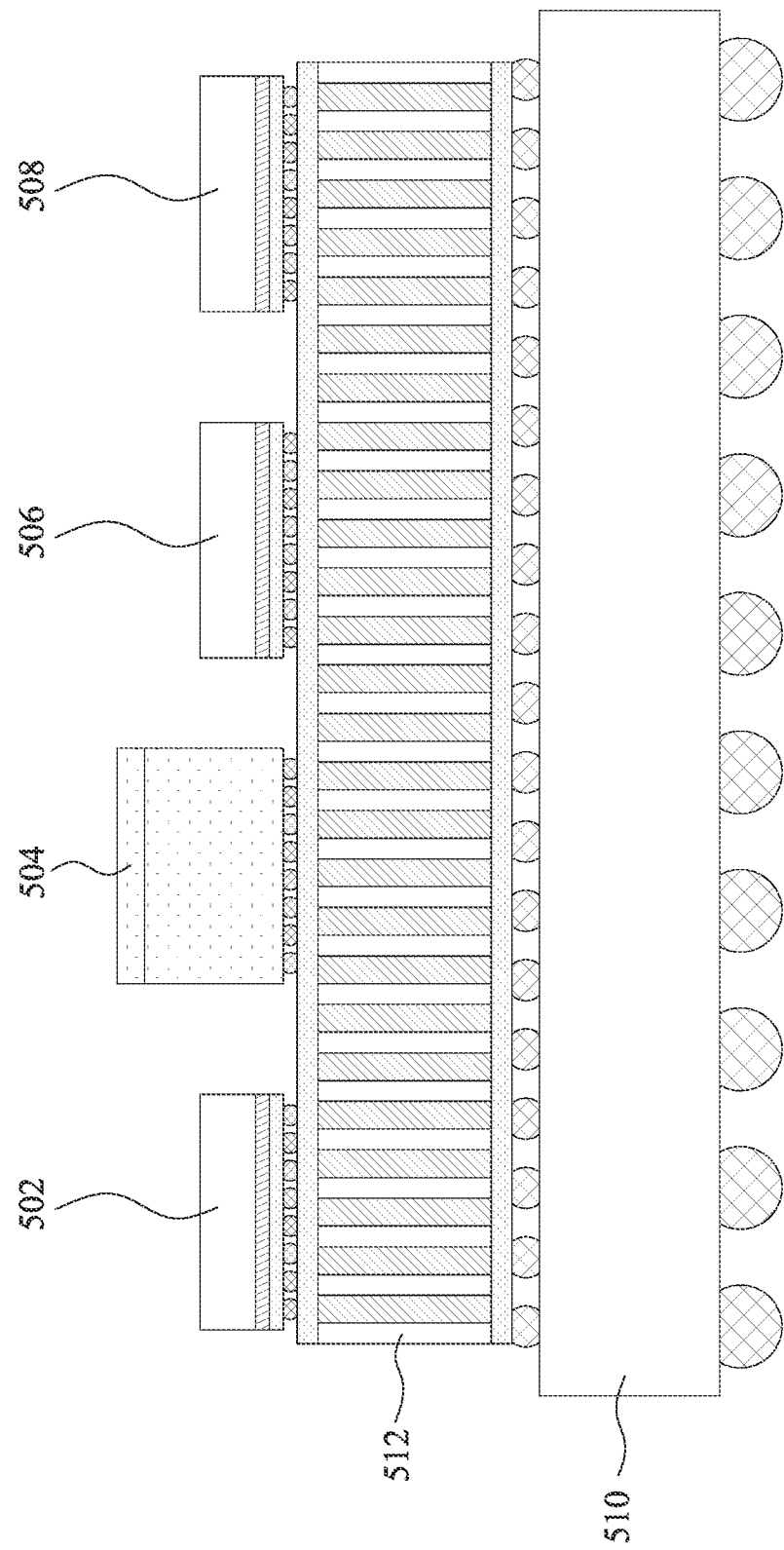
FIG. 5 illustrates a cross-section view of a semiconductor device, in accordance with some comparative embodiments of the present disclosure.

FIG. 5 illustrates a cross-section view of a semiconductor device 50, in accordance with some comparative embodiments of the present disclosure.

The semiconductor device 50 as shown in FIG. 5 can be part of an electrical apparatus. The semiconductor device 50 can belong to a system of integrated circuits (IC). The semiconductor device 50 includes a logic 502, a memory 504, an integrated passive device (IPD) 506, a Micro Electro Mechanical Systems (MEMS) 508, a substrate 510 and a through silicon via (TSV) 512. The logic 502 can include at least one processing unit. The IPD 506 can include at least one capacitor.

The TSV 512 is formed above the substrate 510. The TSV 512 can be formed on the substrate 510 through a plurality of solder balls. The logic 502, the memory 504, the IPD 506 and the MEMS 508 are formed above the TSV 512. The logic 502, the memory 504, the IPD 506 and the MEMS 508 can be formed on the TSV 512 through a plurality of solder balls. The TSV 512 is formed above the substrate 510. The TSV 512 can be formed on the substrate 510 through a plurality of solder balls.

In the embodiments as shown in FIG. 5, the logic 502 is electrically connected to the IPD 506 through multiple solder balls or routings. The logic 502 is not directly connected to the IPD 506. There is a relatively long electrical path between the logic 502 and the IPD 506 due to the multiple solder balls. Therefore, the voltage loss can be reletively high, the power consuming can be reletively high, and the response speed of the power line can be reletively slow.

In addition, the IPD 506 is reletively far away from the logic 502. The reletively long transmission path for the electrons from the logic 502 to the IPD 506 can have poor efficiency. As a result, the operating voltage for the semiconductor device 50 can have a large variation. For example, the variation of the operating voltage is in the range of 100 mV to 200 mV.

However, in the embodiments of FIG. 2A, the capacitors 202 and 204 are relatively close to the processing unit 292 since the semiconductor die 200A is directly connected to the semiconductor die 200B. The short transmission path for the electrons from the processing unit 292 to the capacitors 202 and 204 can have good efficiency. As a result, the operating voltage for the semiconductor device can have a small variation. For example, the variation of the operating voltage is in the range of 70 mV to 100 mV.

In some embodiments, the capacitors 202 and 204 as shown in FIG. 2A can be DTC. Because the DTC can provide superior performance and higher capacitance per unit area than normal capacitors, the short transmission path for the electrons from the processing unit 292 to the capacitors 202 and 204 can have better efficiency. As a result, the operating voltage for the semiconductor device can have a small variation. For example, the variation of the operating voltage can be in the range of 10 mV to 20 mV.

Some embodiments of the present disclosure provide a semiconductor device. The semiconductor device includes a first semiconductor die comprising a first capacitor, and a second semiconductor die in contact with the first semiconductor die comprising a diode, wherein the first semiconductor die and the second semiconductor die are arranged along a first direction, and the diode is configured to direct electrons accumulated at the first capacitor to a ground.

Some embodiments of the present disclosure provide a semiconductor device. The semiconductor device includes a first semiconductor die, a first capacitor embedded within the first semiconductor die, and a second semiconductor die comprising a processing unit configured to receive a power signal from a power line, wherein the first semiconductor die is stacked on the second semiconductor die, and the first capacitor is electrically connected to the power line and configured to regulate the power signal.

Some embodiments of the present disclosure provide a method for manufacturing a semiconductor device. The method includes forming a first semiconductor die comprising a first deep trench capacitor (DTC); forming a second semiconductor die comprising a processing unit; bounding the first semiconductor die and the second semiconductor die; and electrically connecting the first deep trench capacitor to a power line configured to provide a power signal to the processing unit.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
    a first semiconductor die comprising a first capacitor and a second capacitor electrically connected with the first capacitor; and
    a second semiconductor die in contact with the first semiconductor die, the second semiconductor die comprising a diode, wherein the first semiconductor die and the second semiconductor die are arranged along a first direction, the diode is configured to direct electrons accumulated at the first capacitor to a ground, and the second capacitor is spaced apart from the first capacitor along a second direction vertical to the first direction.

2. The semiconductor device of claim 1, wherein the first semiconductor die further comprises a first conductive contact, the second semiconductor die further comprises a second conductive contact, and wherein the first semiconductor die and the second semiconductor die are directly connected through the first conductive contact and the second conductive contact.

3. The semiconductor device of claim 1, wherein the first semiconductor die further comprises a conductive via configured to receive a power signal, and wherein the first capacitor is electrically connected to the conductive via.

4. The semiconductor device of claim 1, wherein the diode is configured to be reversely biased.

5. The semiconductor device of claim 1, wherein the diode comprises a cathode electrically connected to the first capacitor and an anode electrically connected to the ground.

6. The semiconductor device of claim 1, wherein the first capacitor is encapsulated within an insulation layer of the first semiconductor die extending along the second direction, and a depth of the first capacitor is smaller than a thickness of the insulation layer.

7. The semiconductor device of claim 6, wherein a distance between the first capacitor and the second capacitor is smaller than the depth of the first capacitor and a depth of the second capacitor.

8. The semiconductor device of claim 6, wherein the first semiconductor die further comprises a conductive via penetrating the insulation layer, and the depth of the first capacitor is smaller than a length of the conductive via.

9. A semiconductor device comprising:
    a first semiconductor die;
    a first capacitor embedded within the first semiconductor die;
    a second capacitor embedded within the first semiconductor die and electrically connected with the first capacitor; and
    a second semiconductor die comprising a processing unit configured to receive a power signal from a power line, wherein the first semiconductor die is stacked on the second semiconductor die along a first direction, the first capacitor is electrically connected to the power line and configured to regulate the power signal, and the second capacitor is spaced apart from the first capacitor along a second direction vertical to the first direction.

10. The semiconductor device of claim 9, further comprising:
    a diode embedded within the second semiconductor die for directing the electrons accumulated at the first capacitor to a ground.

11. The semiconductor device of claim 10, wherein the diode is configured to be reversely biased.

12. The semiconductor device of claim 10, wherein the diode comprises a cathode electrically connected to the first capacitor and an anode electrically connected to the ground.

13. The semiconductor device of claim 9, wherein the first capacitor and the second capacitor are deep trench capacitors (DTC).

14. The semiconductor device of claim 13, wherein depths of the first capacitor and the second capacitor are greater than 6 um.

15. The semiconductor device of claim 13, wherein distance between the first capacitor and the second capacitor is greater than 5 um.

16. The semiconductor device of claim 15, wherein the first semiconductor die further comprises a conductive via adjacent the first capacitor, and a length of the conductive via is greater than the depth of the first capacitor.

17. The semiconductor device of claim 9, wherein the first capacitor is encapsulated within an insulation layer of the first semiconductor die extending along the second direction.

18. A method for manufacturing a semiconductor device, comprising:
    forming a first semiconductor die comprising a first deep trench capacitor (DTC) and a second deep trench capacitor;
    forming a second semiconductor die comprising a processing unit;
    stacking the first semiconductor die on the second semiconductor die along a first direction; and
    electrically connecting the first deep trench capacitor to a power line configured to provide a power signal to the processing unit, wherein the second deep trench capacitor is spaced apart from the first deep trench capacitor along a second direction vertical to the first direction, and a distance between the first deep trench capacitor and the second deep trench capacitor is smaller than a depth of the first deep trench capacitor.

19. The method of claim 18, further comprising:
    forming a diode within the second semiconductor die electrically connected to the first deep trench capacitor.

20. The method of claim 19, further comprising:
    directing electrons accumulated at the first deep trench capacitor to a ground by the diode.

* * * * *